United States Patent
Tsai et al.

(10) Patent No.: US 6,787,056 B2
(45) Date of Patent: Sep. 7, 2004

(54) PLANARIZATION METHOD USING ANISOTROPIC WET ETCHING

(75) Inventors: Wen-Bin Tsai, Tainan (TW); Ching-Yu Chang, Ilan Hsien (TW); Chun-Pei Wu, Nantou Hsien (TW); Huei-Huang Chen, Changhua (TW); Samuel C. Pan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 111 days.

(21) Appl. No.: 10/067,260

(22) Filed: Feb. 7, 2002

(65) Prior Publication Data
US 2003/0146190 A1 Aug. 7, 2003

(51) Int. Cl.[7] .......................... B44C 1/22; H01L 21/00; H01L 21/302
(52) U.S. Cl. .............. 216/95; 216/96; 216/99; 252/79.1; 438/692; 438/723; 438/733
(58) Field of Search .................. 216/95, 96, 99; 252/79.1; 438/692, 723, 733

(56) References Cited

U.S. PATENT DOCUMENTS

| 4,106,975 A | * | 8/1978 | Berkenblit et al. ........... 216/47 |
| 5,294,562 A | * | 3/1994 | Lur et al. ................... 438/427 |
| 5,310,457 A | * | 5/1994 | Ziger ......................... 438/703 |
| 5,622,636 A | * | 4/1997 | Huh et al. ..................... 438/5 |
| 6,123,865 A | * | 9/2000 | Lin et al. ..................... 216/91 |
| 6,245,683 B1 | * | 6/2001 | Liu ............................ 438/702 |
| 6,447,694 B1 | * | 9/2002 | Lee et al. ................... 252/79.1 |

FOREIGN PATENT DOCUMENTS

JP            11-286791 A2 * 10/1999  ........ H01L/21/308

* cited by examiner

*Primary Examiner*—Nadine Norton
*Assistant Examiner*—Shamim Ahmed
(74) *Attorney, Agent, or Firm*—Dickinson Wright PLLC

(57) ABSTRACT

A planarization method using anisotropic etching can be applied to planarize an insulating layer with an uneven surface on a substrate. $H_2SO_4$, $H_3PO_4$, HF and $H_2O$ are mixed to form an etching solution. The substrate is placed into the etching solution to make the etching solution pass the surface of the insulating layer at a flow rate to etch the insulating layer. After a period of etching time, the insulating layer with a more planar surface can be obtained.

14 Claims, 4 Drawing Sheets

PLANARIZATION METHOD USING ANISOTROPIC WET ETCHING

BACKGROUND OF THE INVENTION

1. Field of Invention

The present invention relates to a planarization method. More particularly, the present invention relates to a planarization method using anisotropic wet etching.

2. Description of Related Art

Dielectric material is used to isolate metal lines in the multilevel interconnects process to prevent shorts from occurring between two metal lines. Dielectric material used between two layers of metal lines is called intermetal dielectric (IMD). Because the surface of wafer is rugged after metal lines are formed thereon, the dielectric material subsequently deposited is also rugged. Therefore, the flatness of the IMD is the determining factor for the patterning of vias therein and metal wires thereon.

The planarization process is the key step for ensuring that high-density lithography can be performed, because light scattering problems can only be avoided in exposure steps when an IMD with sufficient flatness is provided. Therefore, when the IMD is sufficiently flat, a precise pattern-transferring step can be performed. Chemical mechanical polishing (CMP) is the technique that provides global planarization in current semiconductor processing. The CMP technique involves using a reagent to form a chemically altered layer on the non-planar surface of the material to be polished, followed by a mechanical removal of the chemically altered layer from the underlying bulk material.

The polishing slurry or the reagent used in a CMP process consists of a solvent and abrasive particles dispersed in the solvent. The solvent of the slurry chemically depletes, loosens, or modifies the composition of the material to be removed. The highly abrasive particles in the slurry, in combination with the rotating polishing pad, then physically remove the chemically modified unwanted material and polish the underlying surface. Since the abrasive particles in the polishing slurry are structurally very hard, scratches are easily induced on the surface of some materials during the CMP process. The problem of bridging is then likely to occur in the subsequent process, which affects the reliability of the device. A wet cleaning step is additionally needed to remove the abrasive particles used during the CMP.

SUMMARY OF THE INVENTION

The present invention provides a planarization method using anisotropic wet etching. According to one preferred embodiment of this invention, this method can be applied to planarize an insulating layer with an uneven surface on a substrate. $H_2SO_4$, $H_3PO_4$, HF and $H_2O$ are mixed to form an etching solution. The substrate is placed into the etching solution to make the etching solution pass the surface of the insulating layer at a flow rate to etch the insulating layer. After a period of etching time, the insulating layer with a more planar surface can be obtained.

The concentrations of the $H_2SO_4$, $H_3PO_4$, and HF are respectively about 98% wt., about 85% wt., and about 1% wt. The volume ratio of $H_2SO_4$ and $H_3PO_4$: HF is about 50–100:1, and the etching rate of the etching solution to an insulating layer with a planar surface is about 50–80 Å/min.

The invention also provides a planarization method using anisotropic wet etching. A dummy pattern is formed on a region that has a lower pattern density to minimize the etching rate's difference of regions having different pattern density.

According to another preferred embodiment of this invention, a first insulating layer is on a substrate, and the first insulating layer has large trenches and small trenches therein. A second insulating layer is conformably formed on the first insulating layer, and a thickness of the second insulating layer is about the same as a depth of the large and the small trenches. The second insulating layer is patterned to form protrusions in the large trenches, and a distance between the neighboring protrusions is about the same as the width of the small trenches. $H_2SO_4$, $H_3PO_4$, HF and $H_2O$ are mixed to form an etching solution. The substrate is then placed into the etching solution to make the etching solution pass the surface of the first and the second insulating layer at a flow rate to etch the first and the second insulating layers.

The concentrations of the $H_2SO_4$, $H_3PO_4$, and HF are respectively about 98% wt., about 85% wt., and about 1% wt. The volume ratio of $H_2SO_4$ and $H_3PO_4$:HF is about 50–100:1, and the etching rate of the etching solution to an insulating layer with a planar surface is about 50–80 Å/min.

This invention utilizes an etching solution having different flow rate on a thin film having a rugged surface to etch the protrusions at a larger etching rate then the recess. Hence, the rugged surface of the thin film is planarized.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
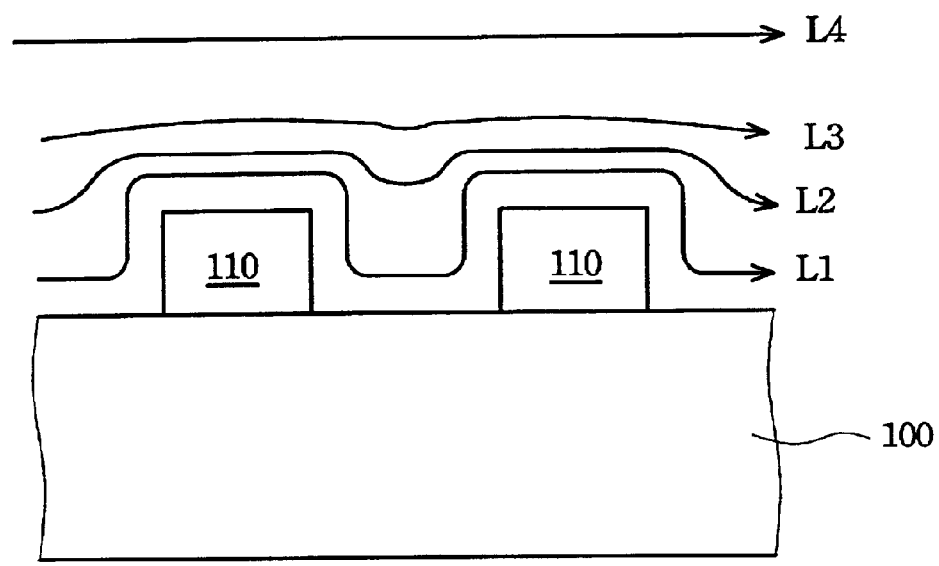
FIG. 1 is a diagram of liquid flowing by a rugged surface.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of liquid flowing by a rugged surface. In FIG. 1, there are protrusions 110 on a substrate 100. When liquid flows by the surface of the substrate 100, according to the distance from the substrate 100, from short to long, the flows are marked as L1, L2, L3 and L4. Since the flow L1 is closest to the surface of the substrate 100 and it is thus hindered by the protrusions 110, the flow rate is slowest. Contrarily, the flow L4 is furthest to the surface of the substrate 100 and it is hindered by nothing, therefore its flow rate is fastest.

Figure 2:
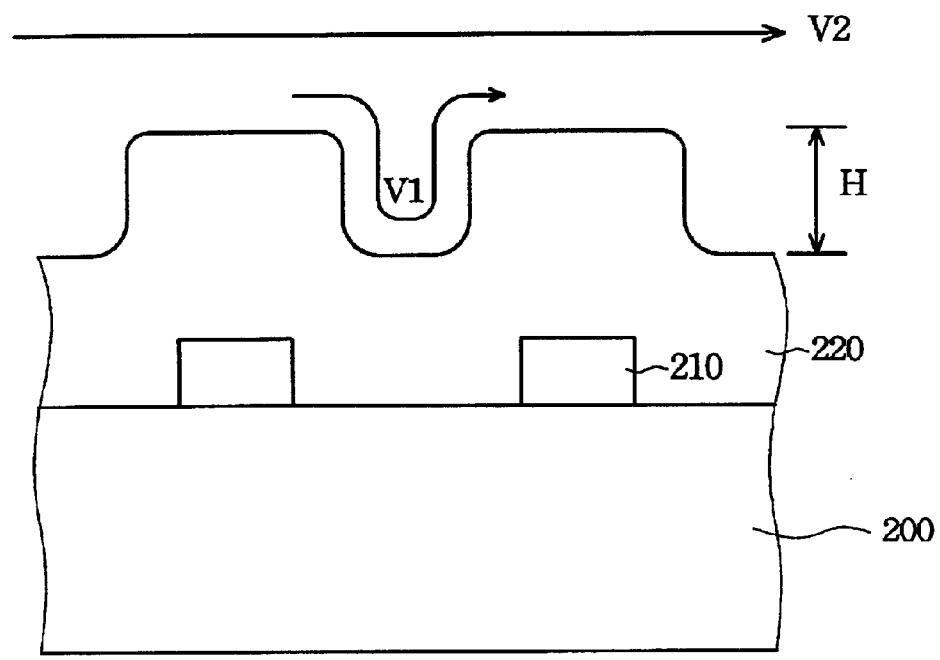
FIGS. 2A–2B are cross-sectional diagrams of a planarization process using anisotropic wet etching according to one preferred embodiment of this invention.
Figure 2:
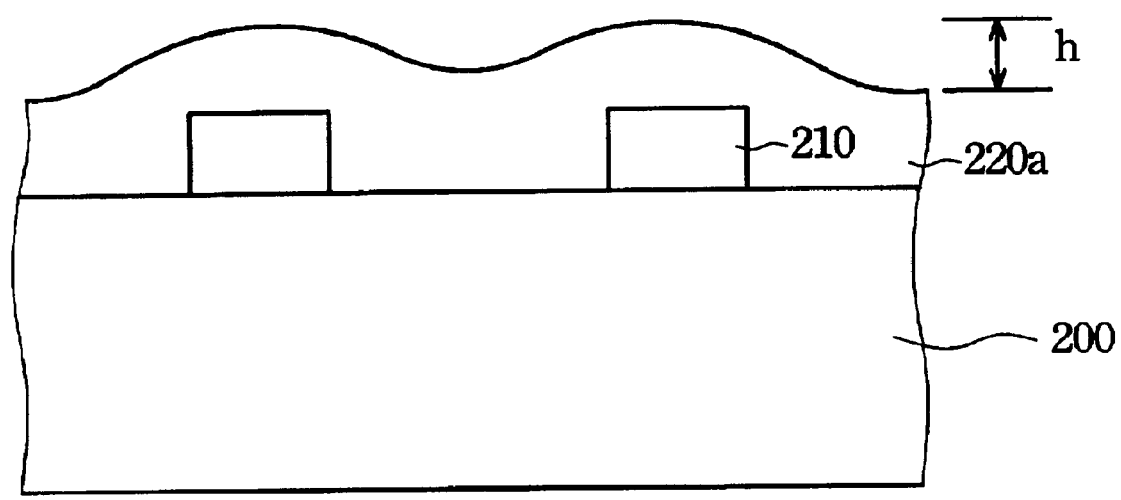

FIGS. 2A–2B are cross-sectional diagrams of a planarization process using anisotropic wet etching according to one preferred embodiment of this invention. In FIG. 2A, conductive lines 210 are on a substrate 200, and conductive lines 210 can be, for example, gates or metal lines. An insulating layer 220 is on the conductive lines 210 and the substrate 200. The surface of the insulating layer 220 is raised and declined with the conductive lines 210 are presented on the substrate 200 or not, and the level difference between the top surface and bottom surface of the insulating layer 220 is H. If the substrate 200 is placed into an etching solution and the etching solution flows by the surface of the insulating-layer 220. The flow rate of the etching solution near the surface of the insulating layer 220 is V1, and the flow rate of the etching solution at a distance from the surface of the insulating layer 220 is V2.

In FIG. 2B, after a period of time of etching, the insulating layer 220 is transformed to the insulating layer 220a. The level difference between the top surface and bottom surface of the insulating layer 220a is h, and h is much smaller than H. Therefore, the planarity of the insulating layer 220a is much better than the insulating layer 220. In the etching reaction, the etching rate is determined by the arrival rate of the etchant molecules to the surface being etched. Consequently, the flow rate of the etching solution is approximately proportional to the etching rate. The flow rate V1 of the etching solution near the surface of the insulating layer 220 is slower, and the etching rate of the bottom surface is slower. The flow rate V2 of the etching solution at a distance from the surface of the insulating layer 220 is faster, and the etching rate of the top surface is faster.

Figure 3A:
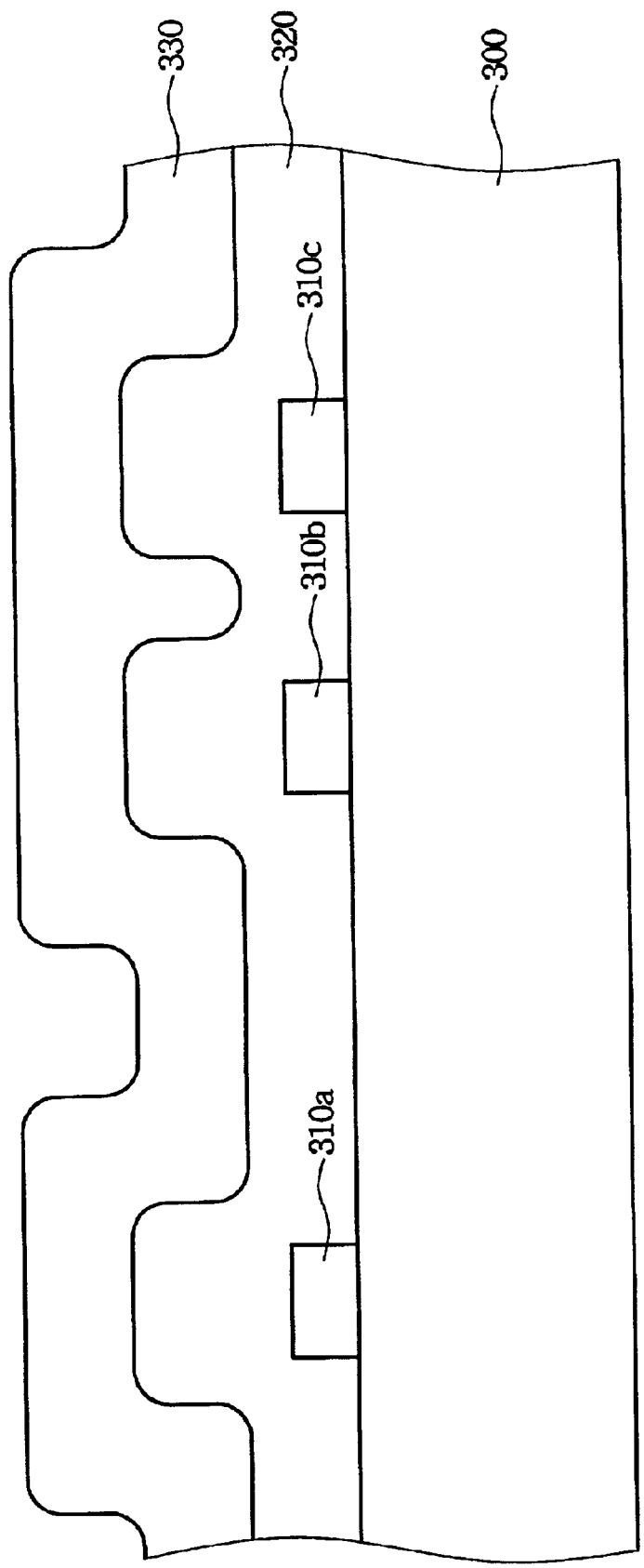
FIGS. 3A–3B are cross-sectional diagrams of a planarization process using anisotropic wet etching according to another preferred embodiment of this invention.
Figure 3:
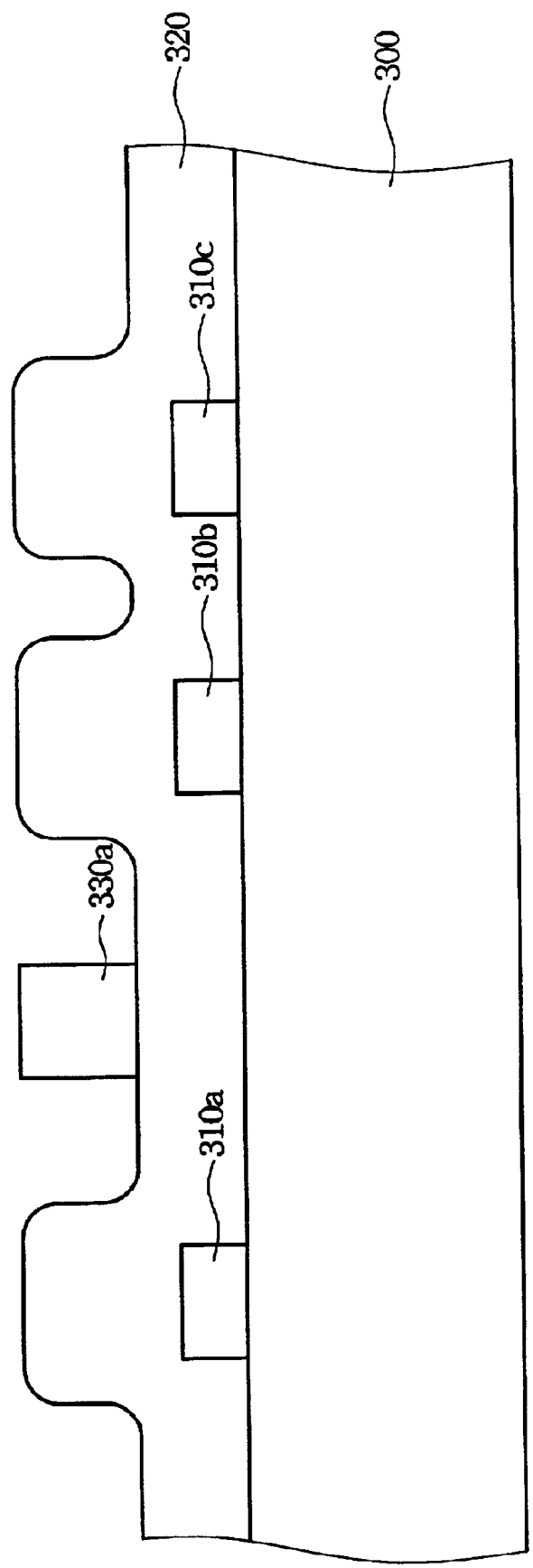

FIGS. 3A–3B are cross-sectional diagrams of a planarization process using anisotropic wet etching according to another preferred embodiment of the present invention. In FIG. 3A, conductive lines 310a, 310b and 310c are on substrate 300, and conductive lines 310a, 310b and 310c can be, for example, gates or metal lines. An insulating layer 320 is then formed on the conductive lines 310a, 310b and 310c and the substrate 300.

The distance between conductive lines 310a and 310b is larger, i.e., the pattern density is lower in this area. The distance between conductive lines 310b and 310c is shorter, i.e., the pattern density is higher in this area. Therefore, the etching solution flows by the area between conductive lines 310a and 310b at a higher flow rate and flows by the area between conductive lines 310b and 310c at a lower flow rate. That is, the etching rate is higher in the area between conductive lines 310a and 310b and is lower in the area between conductive lines 310b and 310c. Therefore, although the levels of the area between conductive lines 310a and 310b and the area between conductive lines 310b and 310c are the same, the etching rate is different. This problem can be solved by a dummy pattern.

The method of forming a dummy pattern comprises forming an insulating layer 330 on the insulating layer 320 in FIG. 3A. The material of the insulating layer 330 is preferred to be the same as that of the insulating layer 320, and the thickness of the insulating layer 320 is about the same as the level difference between the top surface and bottom surface of the insulating layer 320. In FIG. 3B, a dummy pattern 330a is formed after photolithography and etching. Therefore, the pattern density of the area between the conductive lines 310a and 310b is about the same as the area around the conductive lines 310b and 310c, and thus the etching rate can be almost the same in these two areas. The steps to be performed are similar in the description of FIG. 3B, therefore they are omitted here.

From the embodiments described above, this invention can use a single step to planarize a rugged surface to increase its planarity. Hence the CMP's drawbacks such as scratches and removing abrasive particles can be eliminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A planarization method using anisotropic wet etching, which can be applied on a substrate having a first insulating layer thereon, the first insulating layer having large trenches and small trenches therein, comprising:

conformably forming a second insulating layer on the first insulating layer, a thickness of the second insulating layer is about the same as a depth of the large and the small trenches;

patterning the second insulating layer to form protrusions in the large trenches, a distance between the neighboring protrusions is about the same as the width of the small trenches;

mixing $H_2SO_4$, $H_3PO_4$, HF and $H_2O$ to form an etching solution; and placing the substrate into the etching solution to make the etching solution pass the surface of the first and the second insulating layer at a flow rate to etch the first and the second insulating layer.

2. The planarization method of claim 1, wherein the concentration of the $H_2SO_4$ is about 98% by weight.

3. The planarization method of claim 1, wherein the concentration of the $H_3PO_4$ is about 85% by weight.

4. The planarization method of claim 1, wherein the concentration of the HF is about 1% by weight.

5. The planarization method of claim 1, wherein the volume ratio of $H_2SO_4$ and $H_3PO_4$: HF is about 50–100:1.

6. The planarization method of claim 1, wherein the etching rate of the etching solution to an insulating layer with a planar surface is about 50–80 Å/mm.

7. The planarization method of claim 1, wherein the first insulating layer is a silicon oxide layer.

8. The planarization method of claim 1, wherein the second insulating layer is a silicon oxide layer.

9. A planarization method using anisotropic wet etching, which can be applied on a substrate having an insulating layer thereon, the insulating layer having large trenches and small trenches therein, comprising:

using an insulating material to form protrusions in the large trenches, wherein a distance between the neighboring protrusions is about the same as the width of the small trenches and a thickness of the protrusions is about the same as a depth of the large and the small trenches;

mixing $H_2SO_4$, $H_3PO_4$, HF and $H_2O$ to form an etching solution; and placing the substrate into the etching solution to make the etching solution pass the surface of the insulating layer and the protrusions at a flow rate to etch the insulating layer and the protrusions.

10. The planarization method of claim 9, wherein the concentration of the $H_2SO_4$ is about 98% by weight.

11. The planarization method of claim 9, wherein the concentration of the $H_3PO_4$ is about 85% by weight.

12. The planarization method of claim 9, wherein the concentration of the HF is about 1% by weight.

13. The planarization method of claim 9, wherein the volume ratio of $H_2SO_4$ and $H_3PO_4$: HF is about 50–100:1.

14. The planarization method of claim 9, wherein the etching rate of the etching solution to an insulating layer with a planar surface is about 50–80 Å/min.

* * * * *